United States Patent [19]

Fong et al.

[11] Patent Number: 5,367,300
[45] Date of Patent: Nov. 22, 1994

[54] SERIAL DATA COMMUNICATION INTERFACE ARCHITECTURE

[75] Inventors: Edison Fong, Sunnyvale; Smaragda Denton, Belmont; Nghiem Nguyen, Mountain View, all of Calif.

[73] Assignee: National Semiconductor Corporation, Santa Clara, Calif.

[21] Appl. No.: 80,687

[22] Filed: Jun. 22, 1993

Related U.S. Application Data

[63] Continuation of Ser. No. 829,725, Jan. 30, 1992, abandoned.

[51] Int. Cl.$^5$ .............................................. H03M 9/00
[52] U.S. Cl. ..................................... 341/101; 341/100
[58] Field of Search ................. 341/101, 100, 106, 110

[56] References Cited

U.S. PATENT DOCUMENTS 4,652,874  3/1987  Loyer ............................ 340/825.05

OTHER PUBLICATIONS

National Semiconductor Paper "ADC0819 8-Bit Serial I/O A/D Converter with 19-Channel Multiplexer".

Primary Examiner—Sharon D. Logan
Attorney, Agent, or Firm—Steven F. Caserza

[57] ABSTRACT

A novel serial data communication interface architecture is provided having two modes of operation that are accessed through a chip select signal in combination with a successive approximation registers signal (SARS). Once the internal data conversion begins, the chip select signal may change to any signal state without interrupting the conversion process. Serial interface data output and SARS lines are tri-stated during conversion, while the chip select signal is high. This allows data input, data output, and SARS lines to serve other purposes during conversion. If chip select signal is high at the falling edge of SARS, converted data DO bits are then provided to an internal output register. However, DO data are not immediately routed to the output. Clocking of the output data does not resume until at the first transition to low of chip select signal after the falling edge of SARS. The next conversion is not initiated until the second transition of chip select back to low after the falling edge of SARS signaling the end of conversion.

11 Claims, 9 Drawing Sheets

NONREGISTERED A/D CONVERTER ARCHITECTURE
PRIOR ART
FIG. 1a

REGISTERED A/D CONVERTER ARCHITECTURE
PRIOR ART
FIG. 2a

SERIAL DATA COMMUNICATION INTERFACE ARCHITECTURE

CROSS REFERENCE TO RELATED APPLICATION

This application is a continuation of U.S. application Ser. No. 07/829,725, filed Jan. 30, 1992 now abandoned.

TECHNICAL FIELD

This invention relates to data communication interfaces between electronic circuits, particularly to serial data communication interfaces.

BACKGROUND

It is known to use a plurality of lines in a bus to transmit a plurality of data bits simultaneously, thereby achieving high data transmission rates. However, certain devices, are designed to transmit and receive data in a serial format, thereby sacrificing data rate to minimize the number of interface lines.

Figure 1A:
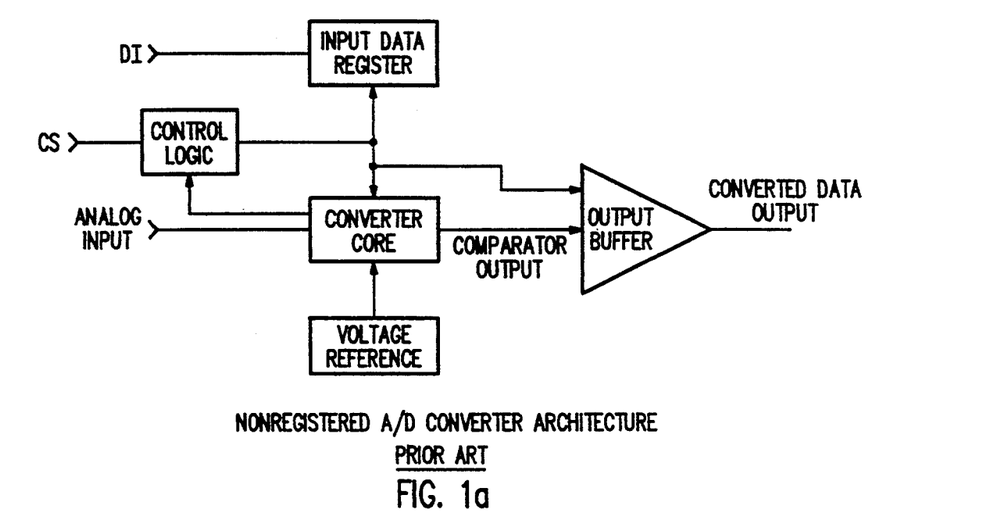
FIG. 1a shows a prior art nonregistered configuration serial communication interface architecture.
Figure 1B:
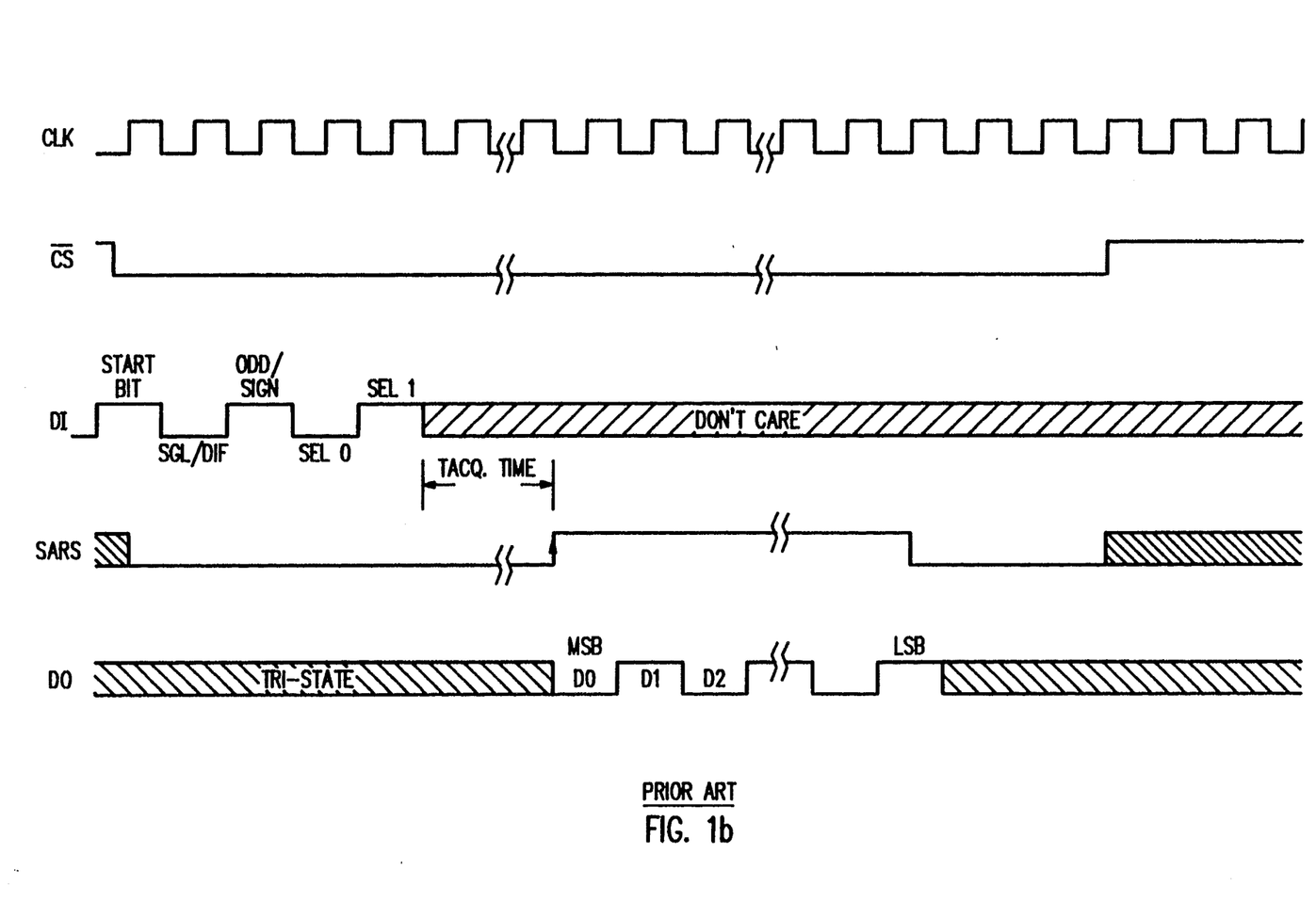
FIG. 1b shows a prior art nonregistered configuration serial communication interface architecture timing diagram.
Figure 2A:
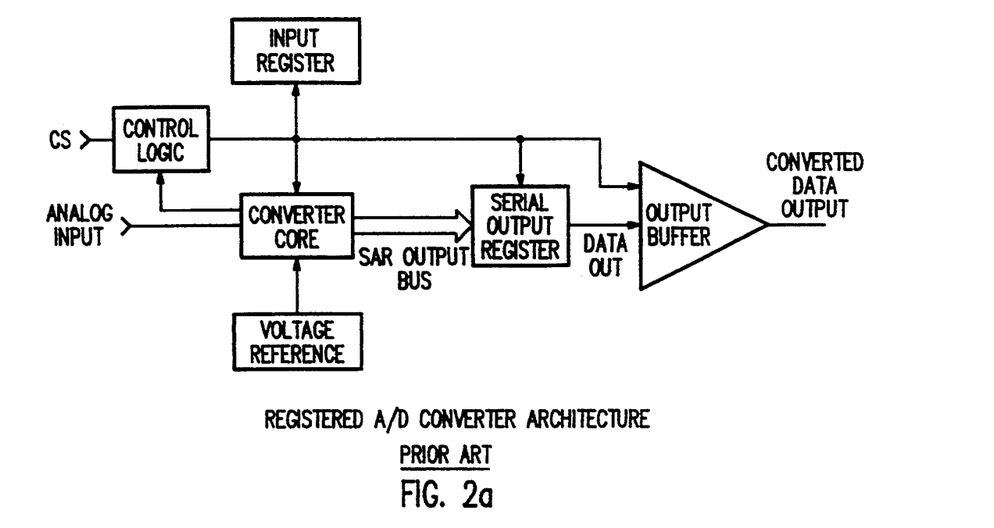
FIG. 2a shows a prior art registered configuration serial communication interface architecture.
Figure 2B:
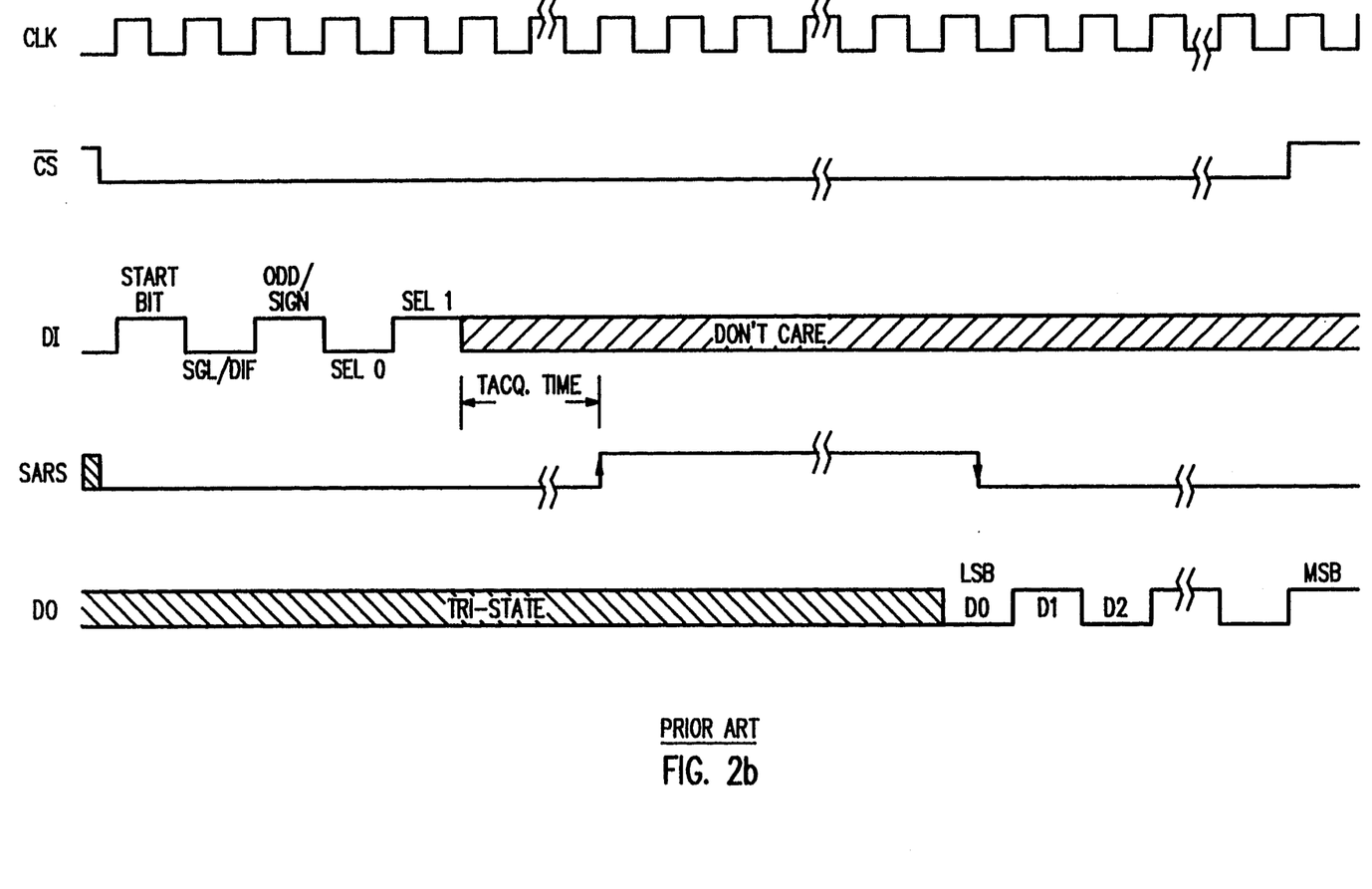
FIG. 2b shows a prior art registered configuration serial communication interface architecture timing diagram.

Two prior art serial communication interface configurations are known and commonly implemented with A/D converters. These two types of configurations are known as the nonregistered configuration and the registered configuration. FIG. 1b illustrates an example of a timing diagram corresponding to a nonregistered type serial interface shown in FIG. 1a, and FIG. 2b shows a timing diagram corresponding to a registered type serial interface of FIG. 2a. In both configurations, conversion begins when the Not Chip Select ("/CS") signal transitions from a logic "one" (high) to a logic "zero" (low). During the first five system clock cycles ("CLK"), the first five data input ("DI") bits provided are latched. These include the start bit, a single-ended or differential mode bit, a sign bit, and two bits for channel selection. After a predefined acquisition period $T_{acq}$ following the falling edge of the fifth CLK cycle, Successive Approximation Registers ("SARS") signal transitions from low to high, indicating the beginning of data conversion, i.e. such as A/D conversion.

FIG. 1b shows a prior art nonregistered format serial communication interface process which invokes conversion of DI bits upon detecting the signal state of /CS signal as being asserted, i.e. low, and Successive Approximation Register Signal (SARS) as being high. Prior art nonregistered configuration serial interfaces output converted data output ("DO") bits during the data conversion. Converted data DO are therefore not stored internally, but are provided serially at a data output signal port (not shown) as each successive DO bit becomes available. As shown in FIG. 1b, converted data bit DO of nonregistered type serial interface is available upon the serial interface detecting the rising edge of SARS, with the most significant bit (MSB) DO bit provided first at the output port. However, the nonregistered approach as shown in FIG. 1b is not always practical beyond 12 bits due to induced noise from the output buffer.

FIG. 2b illustrates a registered configuration serial interface. In the registered format, the converted bits are available at the data output only after the entire conversion process has been completed. During conversion, converted data, DO bits, are temporarily stored in an internal register until conversion of data DI is completed. When SARS transitions from high to low, the falling edge of SARS is used to indicate the end of data conversion. Upon the next rising edge of CLK, DO bits are provided to the data output port (not shown) with the Least Significant Bit (LSB) first. Thus, in the registered type serial interface, the LSB of DO is first routed to the data output signal port followed by the subsequent bits.

In both the registered and the nonregistered configuration the system microprocessor must continuously monitor the status of the conversion, i.e. the changing state of SARS to detect the falling edge of SARS, which is additional overhead for a system microprocessor. Moreover, during this conversion process, /CS must be low for the selected chip to remain active. Since /CS is asserted during a conversion, other chips which share the same input or output ("I/O") signal lines, such as SARS, DO, and DI, cannot be selected during the conversion process. Thus, prior art registered or nonregistered format serial interfaces do not efficiently accommodate systems having multiple A/D converters, or multiple I/O devices.

Figure 3:
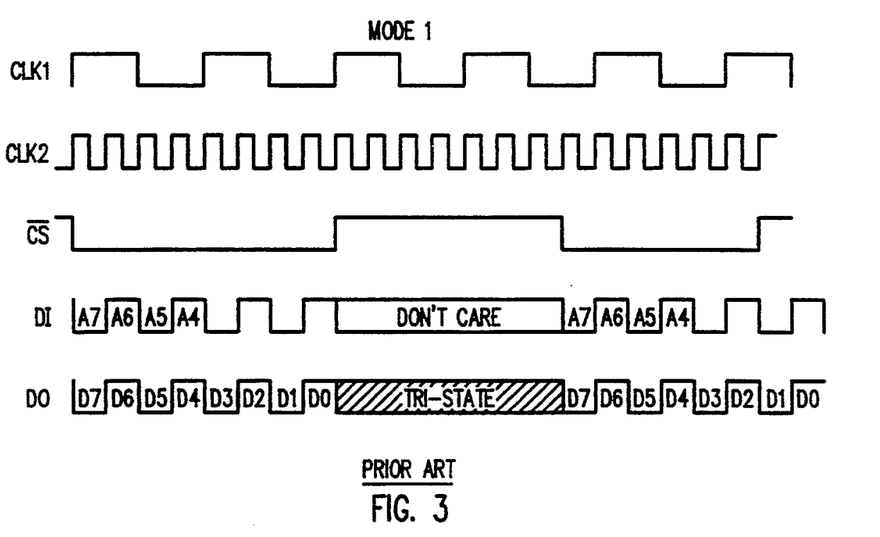
FIG. 3 shows a timing diagram depicting a first operation mode of a prior art modified registered configuration serial communication interface architecture.
Figure 4:
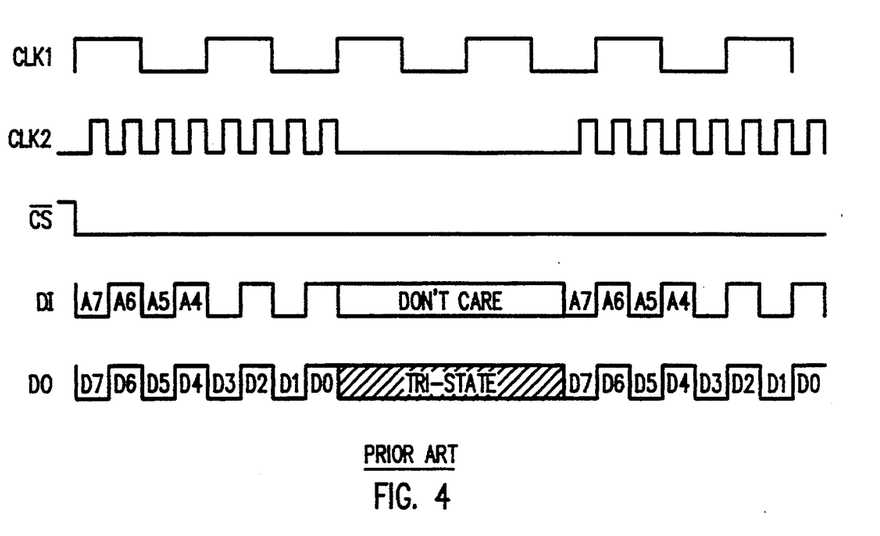
FIG. 4 shows a timing diagram depicting a second operation mode of a prior art modified registered configuration serial communication interface architecture.

Another prior art serial interface uses a modified registered output configuration such as the registered type A/D serial interface ADC0819 ("the ADC0819") provided by National Semiconductor Corporation. The modified registered serial interface of the ADC0819 implements two clock signals for serial interface operation. The first clock (CLK1) is a system operation clock, and the second clock (CLK2) is an I/O interfacing clock. FIGS. 3 and 4 illustrate two alternative modes of operation available with the modified registered serial interface configurations provided by the ADC0819. FIG. 3 shows a first operation mode of ADC0819, where data conversion is invoked with the rising edge of /CS. Since no SARS is provided in the ADC0189, /CS remains high during data conversion. After data conversion is completed, and on the falling edge of /CS, converted data DO bits are provided at a data output port.

FIG. 4 shows a second operation mode of the modified registered output configuration provided by ADC0819. Clock signal CLK2 is used to control the output of converted data DO to the data output port. When the last converted data DO bit is transferred to an output data shift register, CLK2 is inhibited thereby preventing clocking out of DO. After a prescribed time (a minimum of 16 $\mu$sec for the ADC0819), CLK2 is restarted and converted data DO is provided serially to the output port, The modified registered serial interface of ADC0819 not only requires an extra clock signal, but also requires additional overhead control circuitry.

Thus, with prior art registered type serial interface architecture, such as the one exemplified in FIG. 1b, microprocessor overhead exists to continuously monitor for the falling edge of SARS to detect the end of data conversion. Alternatively, in most applications of serial interfaces where data is not needed immediately after conversion, delays to providing the output data DO may be achieved by the modified registered type serial interface ADC0819 (FIGS. 3 and 4). However, such delayed output is achieved at a cost of requiring an additional clock signal. Moreover, inhibiting data output requires precise clock signal edge detection, which is cumbersome to implement and consumes system microprocessor overhead. Although the nonregistered configuration serial interface (shown in FIG. 2b) is faster than registered configuration, the nonregistered configuration serial interface is more sensitive to internal noise. Thus, there is a need for an efficient serial communication interface architecture that provides controllable delay to data output, while minimizing additional circuitry and system overhead.

SUMMARY OF THE INVENTION

A novel serial data communication interface architecture is provided having two modes of operation that are accessed through a chip select signal in combination with a successive approximation registers signal (SARS). A signal edge detector circuit senses both the rising and the falling edges of the chip select signal, while an asynchronous state machine monitors the states of the chip select signal and SARS to determine the operation mode of the serial interface. Once the internal data conversion begins, the chip select signal may change to any signal state without interrupting the conversion process. Serial interface data output and SARS lines are tri-stated during conversion, while the chip select signal is high. This allows data input, data output, and SARS lines to serve other purposes during conversion. If chip select signal is high at the falling edge of SARS, converted data DO bits are then provided to an internal output register. However, DO data are not immediately routed to the output. Clocking of the output data does not resume until the first transition to low of chip select signal after the falling edge of SARS. The next analog-to-digital conversion is not initiated until the second transition of chip select back to low after the falling edge of SARS.

The novel serial interface provides a first and a second operation mode. The operation mode is determined by the state of the chip select signal upon the falling edge of SARS. In the first operation mode, the chip select is low at the end of conversion, output data is provided serially at the output port, as in a conventional format. This mode is fully compatible with present interface standards, such as MICROWIRE TM. However, if chip select is high when the internal SARS goes low, the converted data is stored in an internal parallel-to-serial shift register. At the subsequent falling edge of the chip select signal the data stored in this shift register is clocked out at the output port. The next conversion does not occur until the chip select signal transitions high and then low. In the second operation mode, a subsequent analog-to-digital data conversion is not invoked until the chip select signal transitions from high to low following the completion of a prior conversion.

One embodiment of the circuit implementation of the novel architecture consist of a combination of asynchronous edge detection circuits, asynchronous latches, synchronous latches, and standard logic gates. These blocks are used to track the previous state and present state of signal edges which determines the operation mode of the chip.

DESCRIPTION OF SPECIFIC EMBODIMENTS

MODE 1 OPERATION

Figure 5:
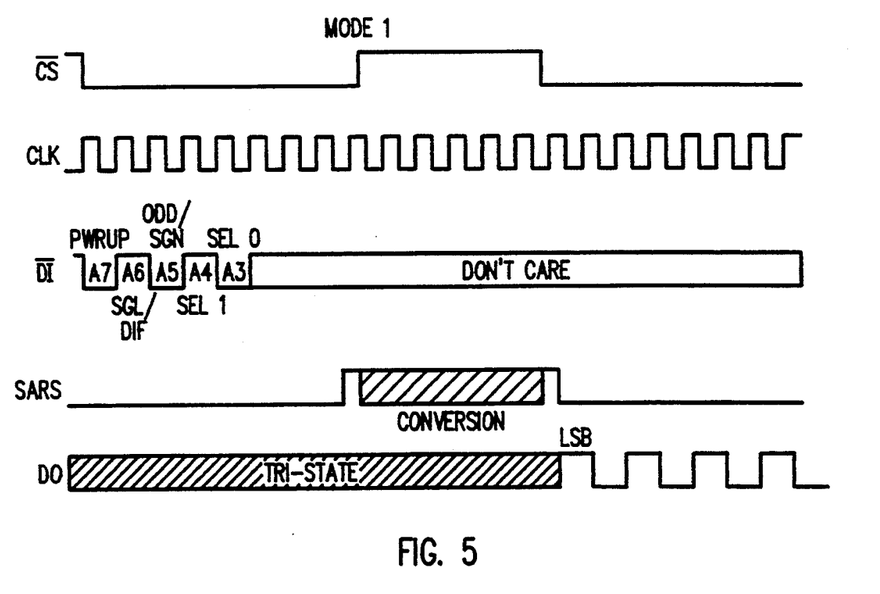
FIG. 5 shows a timing diagram depicting the operation of one embodiment of a serial data communication interface architecture providing serial interfacing in a first operation mode in accordance with the principles of this invention.
Figure 6:
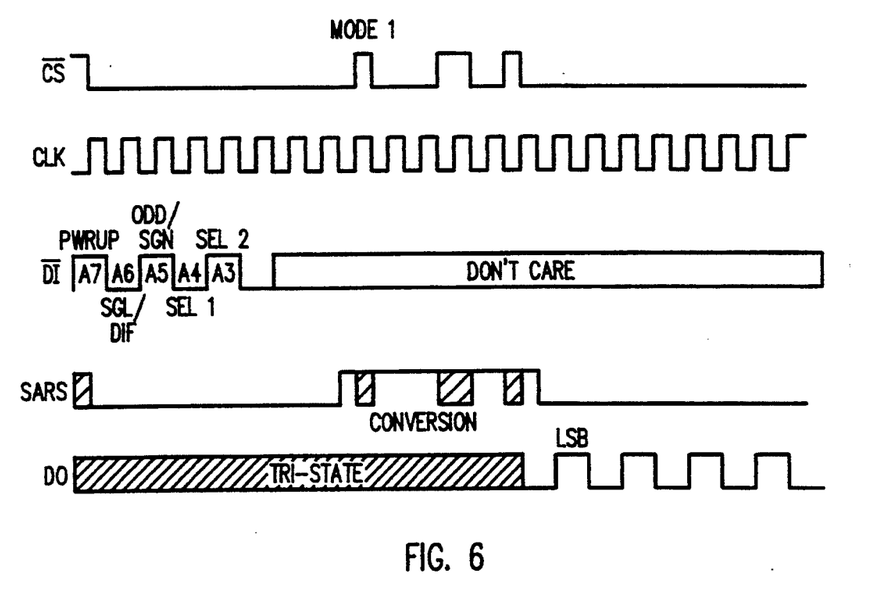
FIG. 6 shows a timing diagram depicting the operation of an alternative embodiment of a first operation mode of the serial data communication interface architecture of FIG. 5.

FIG. 5 illustrates a first mode (MODE 1) operation of one embodiment of a serial interface constructed in accordance with the principles of this invention. This mode is fully compatible with presently commercially available serial interfaces utilizing the MICROWIRE TM format. Clock (CLK) signal, Not Chip Select (/CS) signal, Successive Approximation Registers (SARS) signal, and serial data input bits A7 through A3 are provided as serial interface input signals. A WRCS signal is generated internally using well known digital logic techniques, in order to indicate when serial data bits A7 through A3 have been received and latched, and thus indicate when conversion may begin. Operation mode setup bits, such as PowerUp bit (PWRUP), Single-Ended or Differential bit (SGL-DIF), Sign Bit (ODD-SGN), and two MUX Channel Select Bits, are initially provided to the serial data communication interface on the DI signal line. In FIG. 5, /CS is shown as being high during conversion. However, /CS may also be low during conversion. When /CS is high, DO and SARS become tri-state, and DI is a "don't care", thus allowing DO, SARS and DI signal lines to be used for other operations during the conversion process. In this embodiment, as shown in FIG. 6, during conversion /CS can be in any signal state, including dynamic transitions, without affecting the conversion process. When /CS changes dynamically during conversion, DO remains in tri-state, but SARS becomes active when /CS becomes active. Thus, the status of the conversion process can be monitored periodically, while DI, SARS and DO signal lines are available to the system for other tasks during conversion.

In FIG. 5 and 6, /CS is low at the end of conversion. DO bits, with the LSB data first, are clocked out after the falling edge of SARS and with the first subsequent rising edge of CLK. As shown in FIG. 5 and 6, the availability of DI and DO data do not overlap during serial interface operation. For example, while the DI signal line is transmitting input data, the DO signal line is tri-stated. Therefore, DI and DO signal lines can be combined into one signal line to minimize external interface lines.

MODE 2

Figure 7:
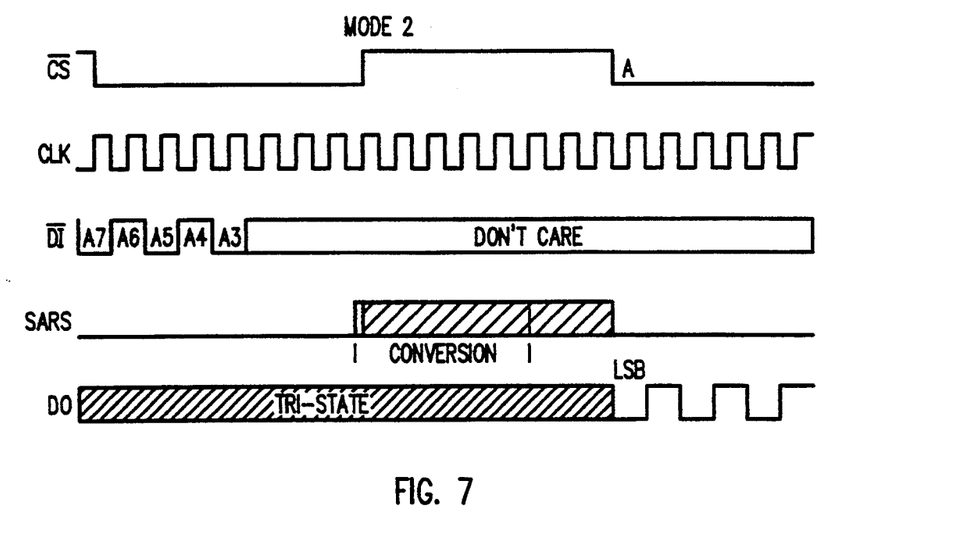
FIG. 7 shows a timing diagram depicting the operation of the serial data communication interface architecture of FIG. 5 providing serial interface of data in a second operation mode.
Figure 8:
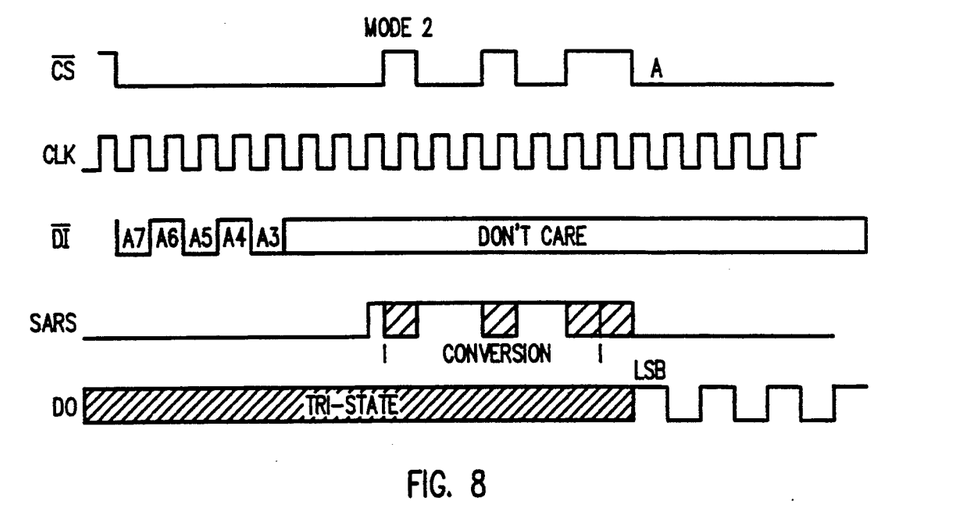
FIG. 8 shows a timing diagram depicting an alternative embodiment of a second operation mode of the serial data communication interface architecture provided in accordance with the principles of this invention.
Figure 9:
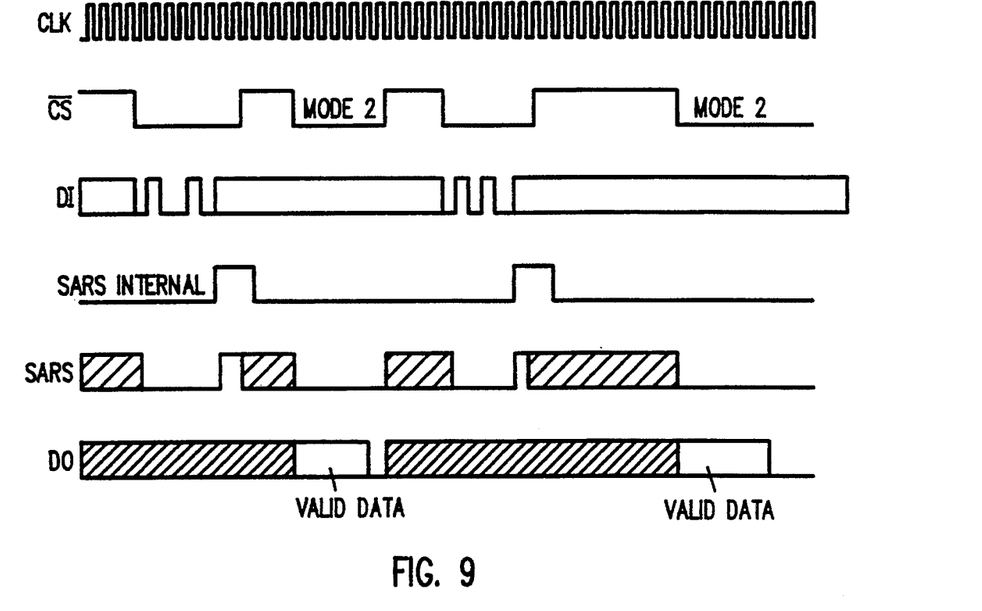
FIG. 9 shows a timing diagram pertaining to another embodiment of a second operation mode of a serial data communication interface architecture shown in FIG. 8.

FIG. 7 shows a second operation mode (MODE 2) of a serial interface described in accordance with the principles of this invention. In MODE 2, /CS signal line is deactivated after SARS goes high, as in MODE 1. However /CS does not transition from high to active low until conversion has completed. In this mode, converted data DO bits are not routed immediately to the output as in MODE 1, rather DO bits are stored indefinitely until /CS is brought active low. At the falling edge of /CS, the DO bits are then provided to DO output port. As in MODE 1, /CS can be deactivated during conversion to free up SARS, DI, and DO signal lines to perform other functions as shown in FIG. 8. Under MODE 2, a new conversion does not start at the falling edge A (shown in FIG. 7 and 8) of /CS, since it is at this edge which triggers the clocking out of DO data. A new analog-to-digital data conversion only starts after /CS transitions from high back to low after falling edge A. Two complete consecutive conversions are shown in FIG. 9. As in MODE 1, DI and DO data do not overlap, and thus it is feasible to combine the DI and DO signal lines together to reduce external interface lines.

Multimode Operation

Figure 10:
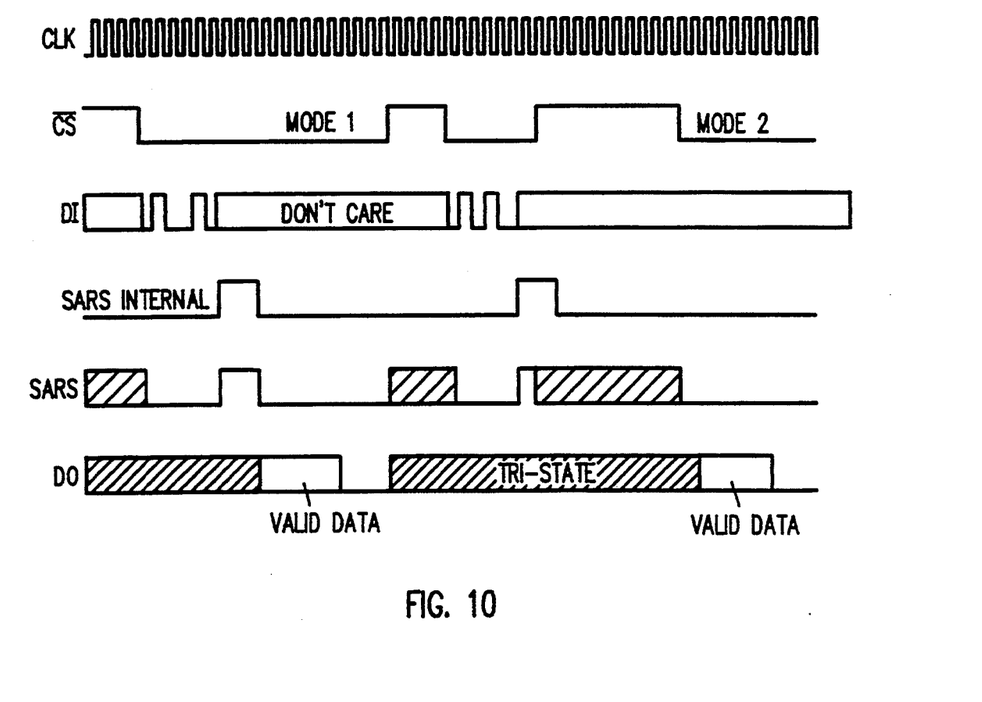
FIG. 10 shows a timing diagram pertaining to another embodiment of a serial data communication interface architecture, illustrating mixed mode operation of dynamically switching from a first operation mode to a second operation mode.
Figure 11:
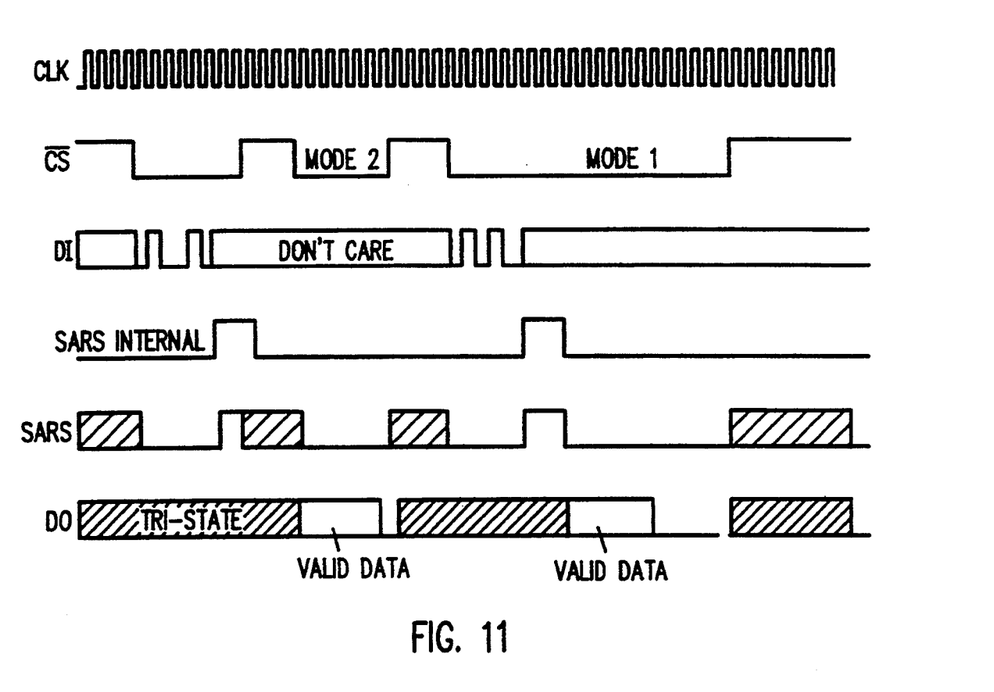
FIG. 11 shows a timing diagram pertaining to another example of a serial data communication interface architecture, illustrating a mixed mode serial interface operation of dynamically switching from a second operation mode to a first operation mode.

The chip can successively change from MODE 1 operation to MODE 2 operation without elaborate control signals, metal mask options, or performance compromises. FIG. 10 shows the chip performing the first conversion in MODE 1 and the second conversion in MODE 2. FIG. 11 demonstrates the other combination with serial interrface 100 (FIG. 12) starting in MODE 2 on the first conversion and ending in MODE 1.

Figure 12:
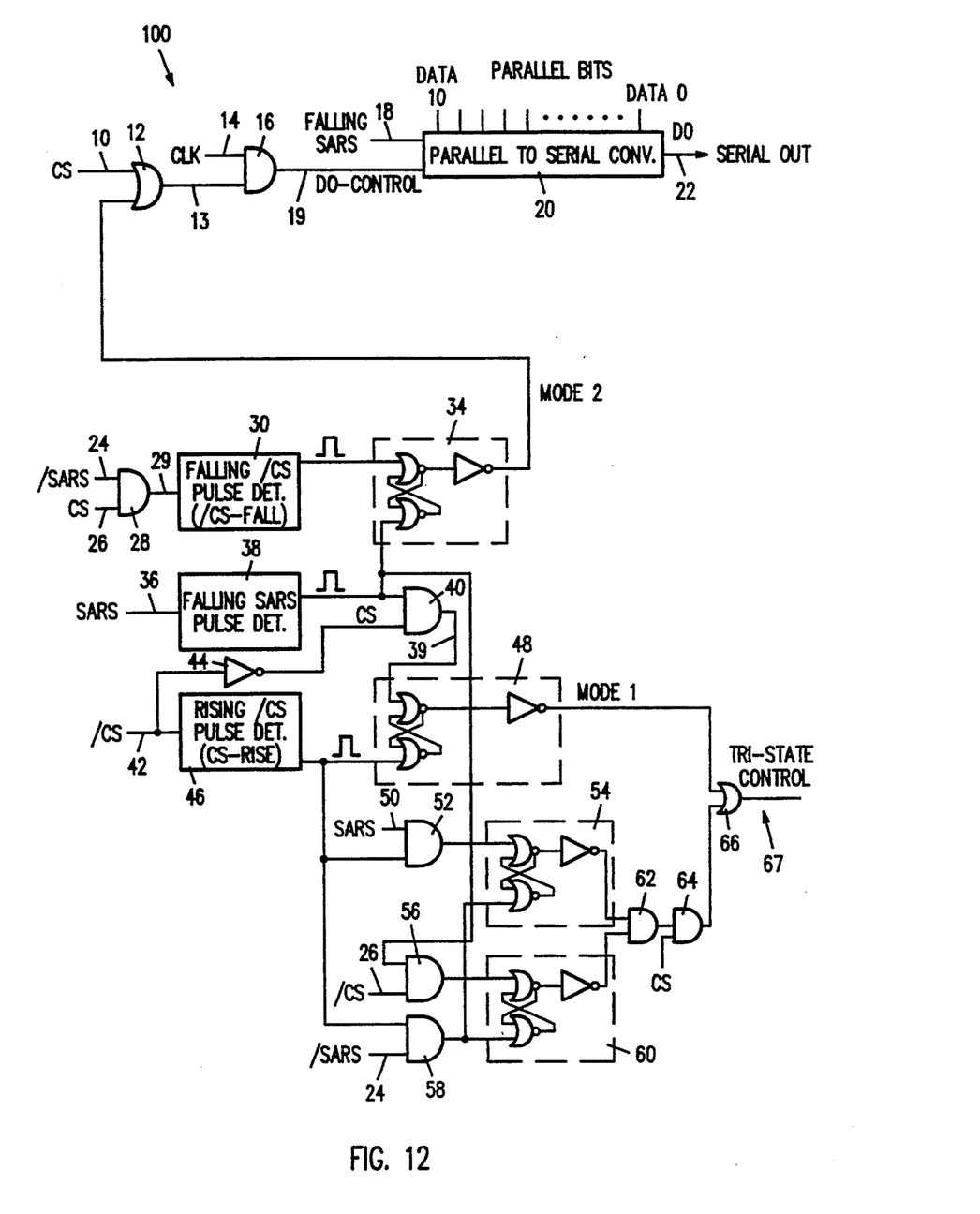
FIG. 12 shows one circuit embodiment of a serial data communication interface constructed in accordance with the principles of this invention.

FIG. 12 shows one embodiment of a serial data communication interface constructed in accordance with the principles of this invention. Serial communication interface 100 receives as input signals, Not Chip Select ("/CS") signal, Successive Approximation Registers ("SARS") signal, Clock ("CLK") signal, and parallel input data ("DATA[10...0]") bits. To achieve MODE 1 operation (shown in FIGS. 5 and 6), AND gate 16 is coupled to Falling /CS Edge Detector 30 and the CLK signal. Upon receiving an asserted signal indicating the detection of a falling edge of /CS signal, in combination with an asserted CLK signal, AND gate 16 asserts DO_CONTROL provided to Parallel-to-Serial Converter 20. Parallel-to-Serial Converter 20 is also coupled to Falling SARS Edge Detector 38 to receive FALLING SARS on Parallel-to-Serial input port 18. Upon receiving an asserted DO_CONTROL and an asserted FALLING SARS, Parallel-to-Serial Converter 20 provides DATA[10...0] as serial data DO at DO serial output port 22.

To invoke MODE 2 operation, Falling /CS Edge Detector 30 is coupled to latch 34 to provide a detected MODE__DETECT signal which inhibits the serial output clock during falling SARS. SARS and /CS are provided to Falling SARS Edge Detector 38. Upon detecting the falling edge of SARS, Falling SARS Edge Detector 38 asserts Detected Falling SARS Edge signal, which is provided to AND gate 40 on output line 39. Rising /CS Edge Detect Circuit 46 provides to Mode_1_Detect Circuit 48 an asserted Rising /CS Edge signal upon detection of the rising edge of /CS. Mode_1_Detect Circuit 48 outputs an asserted MODE_1_DETECT signal upon detection of the falling edge of SARS and the falling edge of /CS. The tri-state control signal generated on lead 67 serves to tri-state the DO lead, so that lead can be used by other devices.

Serial interface 100 requires only one clock signal and allows a single device to accommodate prior art operating modes, as well as the novel operating modes of this invention. For nonregistered operation, appropriate interconnection is made in order to circumvent the use of the serial output register shown in FIG. 2a. This is achieved, for example, using an appropriate metal mask, or dedicated bonding pads which are selected for bonding depending on whether registered or nonregistered operation is desired.

Figure 13:
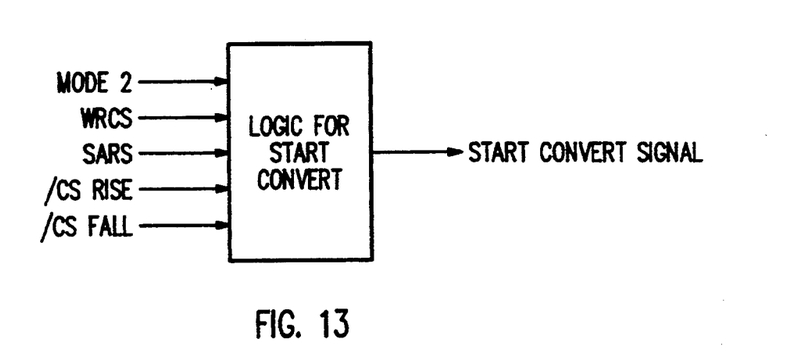
FIG. 13 shows another circuit embodiment of a serial data communication interface constructed in accordance with the principles of this invention.

A second asynchronous state machine shown in FIG. 13 is used to determine the start of a new conversion. Because both MODE_1 and MODE_2 can be accessed simply by the status of /CS and SARS signals, the state machine must have inputs from MODE_2, WRCS, SARS, /CS_RISE, and /CS_FALL. These signals are processed in accordance with FIGS. 5–11.

The invention now being fully described, it will be apparent to one of ordinary skill in the art that many changes and modifications can be made thereto without departing from the spirit or scope of the appended claims.

What is claimed is:

1. A process of converting a set of parallel input data bits received from a data converter into a serial format, said process comprising the steps of:
   providing a set of serial interface input signals, said set of serial interface input signals comprising:
      an input clock signal;
      a chip select signal;
      an internal data conversion status signal; and
      said set of parallel input data bits; and
   detecting said signal status of said chip select signal and said internal date conversion status signal, wherein said serial interface provides said received set of parallel input data bits as a set of serial data output bits in synchronization to said clock signal upon detecting an unasserted state of said chip select signal in combination with an unasserted state of said internal conversion status signal.

2. A serial interface process to provide one or more set of serial data output bits, said process comprising the steps of:

receiving a set of input signals, said input signals comprising
an input clock signal;
a chip select signal;
an internal data conversion status signal; and
said set of parallel input data bits;
detecting a first serial data output ready state comprising the steps of:
detecting an unasserted state of said chip select signal;
detecting an unasserted state of said internal data conversion status signal;
detecting an asserted state of said chip select signal; and
in response thereto, providing said received set of parallel input data bits as a set of serial data output bits in synchronization with said clock signal.

3. A process of converting a set of input data bits comprising the steps of:
providing a set of input signals comprising:
a chip select signal;
an internal data conversion status signal; and
said set of input data bits;
detecting a signal status of said chip select signal and said internal data conversion status signal; and
providing a set of data output bits as a function of said set of input data bits in synchronization with said clock signal upon detecting an unasserted state of said chip select signal in combination with an unasserted state of said internal data conversion status signal.

4. An interface process to provide one or more set of data output bits, said process comprising the steps of:
receiving a set of input signals comprising:
an input clock signal;
a chip select signal;
an internal data conversion status signal; and
a set of input data bits;
detecting a first data output ready state comprising the steps of:
detecting an unasserted state of said chip select signal;
detecting an unasserted state of said internal data conversion status signal; and
detecting an asserted state of said chip select signal; and
in response to said first data output ready state, providing said set of data output bits as a function of said set of input data bits in synchronization with clock signal.

5. A data converter comprising:
a data input port for receiving input data bits;
a data output port for providing output data bits;
a chip select lead for receiving a chip select signal;
a data conversion status lead;
control means for causing said data converter to receive said input data bits in response to an enabled state of said chip select signal;
control means for causing said data converter to manipulate said received input data bits in response to a data conversion signal externally supplied to said data conversion status lead;
control means for supplying a data conversion signal to said data conversion status lead when said data conversion is completed; and
means for supplying on said data output port output data bits resulting from said manipulation of said input data bits, in response to an enabled state of said chip select signal.

6. A data converter as in claim 5 which further comprises a clock input lead for receiving a clock signal, and wherein said input data bits are received in synchronization to said clock signal, and said output data bits are provided in synchronization to said clock signal.

7. A data converter as in claim 5 which further comprises means to provide a high impedance signal on one or more of said data input port, data output port, and chip select lead during at least part of said time said converter is manipulating said input data bits.

8. A data converter as in claim 5 which further comprises an input data buffer for receiving said input data bits.

9. A data converter as in claim 8 wherein said input data port comprises a serial input lead.

10. A data converter as in claim 5 which further comprises an output data buffer for holding said output data bits prior to their being provided on said output data port.

11. A data converter as in claim 10 wherein said output data port comprises a serial data output port.

* * * * *